United States Patent
Kobayashi et al.

(10) Patent No.: US 8,659,138 B2
(45) Date of Patent: Feb. 25, 2014

(54) SEMICONDUCTOR PACKAGE HAVING ELECTRODE ON SIDE SURFACE, AND SEMICONDUCTOR DEVICE

(75) Inventors: Shouichi Kobayashi, Kyoto (JP); Hiroyuki Tanaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/600,971

(22) Filed: Aug. 31, 2012

(65) Prior Publication Data

US 2012/0326293 A1 Dec. 27, 2012

Related U.S. Application Data

(63) Continuation of application No. PCT/JP2011/000725, filed on Feb. 9, 2011.

(30) Foreign Application Priority Data

Mar. 9, 2010 (JP) .................................. 2010-051903

(51) Int. Cl.
*H01L 23/48* (2006.01)
(52) U.S. Cl.
USPC ...................... 257/690; 257/E23.01; 257/738
(58) Field of Classification Search
USPC ............. 257/678, 713, 738, E23.01, E23.06; 438/25, 51, 106
See application file for complete search history.

(56) References Cited

U.S. PATENT DOCUMENTS

2012/0319275 A1* 12/2012 Fukuda et al. ................ 257/738

FOREIGN PATENT DOCUMENTS

| JE | 2008-130932 | | 6/2008 |
| JP | 5-335743 | | 12/1993 |
| JP | 8-250620 | | 9/1996 |
| JP | 8-250624 | | 9/1996 |
| JP | 1996250620 | * | 9/1996 |
| JP | 10-107171 | | 4/1998 |
| JP | 1998107171 | * | 4/1998 |
| JP | 2001-185648 | | 7/2001 |
| JP | 2007-123595 | | 5/2007 |

* cited by examiner

*Primary Examiner* — Jarrett Stark
*Assistant Examiner* — Shahed Ahmed
(74) *Attorney, Agent, or Firm* — Hamre, Schumann, Mueller & Larson, P.C.

(57) ABSTRACT

A semiconductor package includes a substrate, a semiconductor chip disposed on the substrate, and a connection wiring connected electrically to the semiconductor chip. The semiconductor package further includes a sidewall formed of an insulator, an inner electrode formed on a first surface of the sidewall that faces the substrate, and a sidewall external electrode formed on a second surface of the sidewall different from the first surface. The inner electrode and the sidewall external electrode are connected electrically, and the inner electrode is connected to the connection wiring. With this configuration, it is possible to suppress the semiconductor package from being large due to an increase in the number of sidewall external electrodes formed on the side surfaces of the semiconductor package, and to shorten a connection distance between the semiconductor packages by connecting the sidewall external electrodes.

10 Claims, 15 Drawing Sheets

(a)  (b)

(a)          (b)

SEMICONDUCTOR PACKAGE HAVING ELECTRODE ON SIDE SURFACE, AND SEMICONDUCTOR DEVICE

FIELD OF THE INVENTION

The present invention relates to a semiconductor package in which a semiconductor chip is mounted on a substrate, and a semiconductor device configured by combining the semiconductor packages.

BACKGROUND OF THE INVENTION

As a configuration example of a semiconductor chip, for example, JP 2008-130932 A discloses a semiconductor chip having an electrode on its side surface.

FIG. 16 is a cross-sectional view showing a configuration of a conventional semiconductor chip 101 having a side external electrode. The semiconductor chip 101 includes a circuit region 103 formed on a substrate 102, and an electrode pad 104 connected to the circuit region 103. The electrode pad 104 is formed so as to extend to side surfaces of the substrate 102, and functions as a side external electrode.

Such a side external electrode is formed in the following manner. A plurality of circuit regions are formed on a wafer, and conductive portions serving as electrode pads are formed between the adjacent circuit regions. Next, the wafer is partially removed in the region where the conductive portions are formed. Then, a conductive material is filled in the portions where the wafer is removed. Next, the wafer is cut into semiconductor chips, with the filled conductor material attached to the side surfaces of the semiconductor chips. The above-described process forms side external electrodes.

FIG. 17 is a cross-sectional view showing a configuration in which such semiconductor chips are stacked. A first semiconductor chip 111, a second semiconductor chip 112 and a third semiconductor chip 113 are stacked via an adhesive material 114. A side external electrode 115 of each of the semiconductor chips is connected electrically to a side external electrode of another semiconductor chip using a wire 116. With this configuration, it is possible to connect the stacked semiconductor chips electrically to each other without adopting an advanced technology such as a through via.

However, in the above-described configuration, since the side external electrodes are formed on the side surfaces of the semiconductor chips, the sizes of the side external electrodes are small. Therefore, high mounting accuracy is required at the time of arranging the semiconductor chips and connecting the side external electrodes directly.

Further, in the above-described method of forming the side external electrode, it is possible to form only one side external electrode, which is formed on the side surface of the semiconductor chip, in the direction perpendicular to the plane of the semiconductor chip. That is, a plurality of the side external electrodes cannot be arranged in the direction perpendicular to the plane of the semiconductor chip.

Moreover, in the case of making a semiconductor chip having the above-described side external electrode into a semiconductor package, when all of the side external electrodes of the semiconductor chip are made to correspond to electrodes formed on a lower surface (or an upper surface) of the semiconductor package as is usually performed, it is possible to increase the number of electrodes for signals and power sources of the semiconductor chip including side external electrodes, as compared with the case where the semiconductor chip is not provided with the side external electrodes. However, such a configuration increases the number of external connections via the electrodes of the semiconductor package, and hence increases the size of the semiconductor package. Consequently, the size of a semiconductor device having a plurality of the semiconductor packages is increased.

SUMMARY OF THE INVENTION

The present invention solves the above-described conventional problem, and its object is to provide a semiconductor package and a semiconductor device capable of suppressing upsizing of the semiconductor package due to an increase in the number of sidewall external electrodes or side external electrodes formed on side surfaces of the semiconductor package, and shortening a connection distance between the semiconductor packages.

A first semiconductor package of the present invention includes: a substrate; a semiconductor chip that is disposed on the substrate; and a connection wiring that is connected electrically to the semiconductor chip. In order to solve the above-described problem, the semiconductor package further includes: a sidewall that is formed of an insulator; an inner electrode that is formed on a first surface of the sidewall that faces the substrate; and a sidewall external electrode that is formed on a second surface of the sidewall that is different from the first surface. The inner electrode and the sidewall external electrode are connected electrically, and the inner electrode is connected to the connection wiring.

Further, a second semiconductor package of the present invention includes: a wiring substrate; a front surface wiring layer that is disposed on a front surface of the wiring substrate; a plurality of inner wiring layers that are disposed inside the wiring substrate; a back surface wiring layer that is disposed on a back surface of the wiring substrate; a semiconductor chip that is mounted on the front surface of the wiring substrate and connected electrically to the front surface wiring layer; a first via that is formed in a thickness direction of the wiring substrate and connects the front surface wiring layer and a first inner wiring layer among the plurality of inner wiring layers; a second via that connects a second inner wiring layer among the plurality of inner wiring layers and the back surface wiring layer; a first side external electrode that is formed on a side surface of the wiring substrate and connected to the first inner wiring layer; and a second side external electrode that is formed on the side surface of the wiring substrate and connected to the second inner wiring layer. The first side external electrode and the second side external electrode are arranged separately in the thickness direction of the wiring substrate. A first electrical passage including the front surface wiring layer, the first via, the first inner wiring layer and the first side external electrode does not contact with a second electrical passage including the second inner wiring layer, the second via, the back surface wiring layer and the second side external electrode.

Further, in order to solve the above-described problem, a first semiconductor device of the present invention includes a plurality of the first semiconductor packages. The plurality of semiconductor packages are disposed so that surfaces thereof provided with the sidewall external electrode are adjacent to each other. The plurality of semiconductor packages are connected electrically by bringing their sidewall external electrodes into contact with each other.

Further, in order to solve the above-described problem, a second semiconductor device of the present invention includes a plurality of the second semiconductor packages. The plurality of semiconductor packages are connected electrically by disposing the first side external electrode or the second side external electrode of one of the plurality of semiconductor packages so as to be in contact with the first side external electrode or the second side external electrode of another semiconductor package.

DESCRIPTION OF THE PREFERRED EMBODIMENTS

Figure 1A:
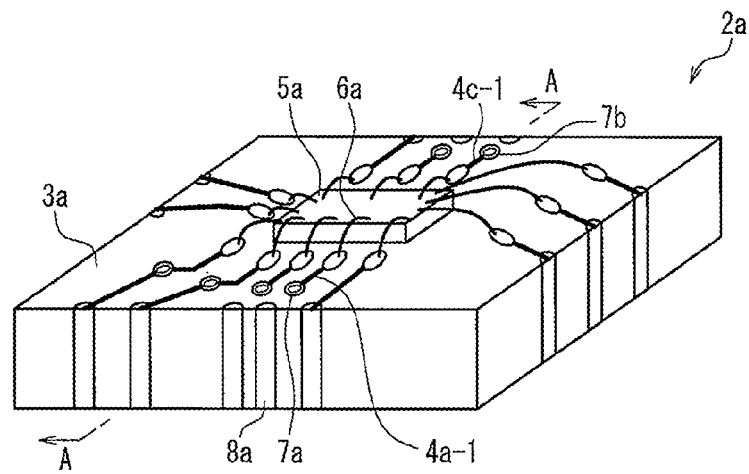
FIG. 1A is a perspective view showing a configuration of a semiconductor package according to Embodiment 1.

A first semiconductor package of the present invention includes: a substrate; a semiconductor chip that is disposed on the substrate; and a connection wiring that is connected electrically to the semiconductor chip. In order to solve the above-described problem, the semiconductor package further includes: a sidewall that is formed of an insulator; an inner electrode that is formed on a first surface of the sidewall that faces the substrate; and a sidewall external electrode that is formed on a second surface of the sidewall that is different from the first surface. The inner electrode and the sidewall external electrode are connected electrically, and the inner electrode is connected to the connection wiring.

Further, a second semiconductor package of the present invention includes: a wiring substrate; a front surface wiring layer that is disposed on a front surface of the wiring substrate; a plurality of inner wiring layers that are disposed inside the wiring substrate; a back surface wiring layer that is disposed on a back surface of the wiring substrate; a semiconductor chip that is mounted on the front surface of the wiring substrate and connected electrically to the front surface wiring layer; a first via that is formed in a thickness direction of the wiring substrate and connects the front surface wiring layer and a first inner wiring layer among the plurality of inner wiring layers; a second via that connects a second inner wiring layer among the plurality of inner wiring layers and the back surface wiring layer; a first side external electrode that is formed on a side surface of the wiring substrate and connected to the first inner wiring layer; and a second side external electrode that is formed on the side surface of the wiring substrate and connected to the second inner wiring layer. The first side external electrode and the second side external electrode are arranged separately in the thickness direction of the wiring substrate. A first electrical passage including the front surface wiring layer, the first via, the first inner wiring layer and the first side external electrode does not contact with a second electrical passage including the second inner wiring layer, the second via, the back surface wiring layer and the second side external electrode.

Further, a first semiconductor device of the present invention includes a plurality of the above-described semiconductor packages. The plurality of semiconductor packages are disposed so that surfaces thereof provided with the sidewall external electrode are adjacent to each other. The plurality of semiconductor packages are connected electrically by bringing their sidewall external electrodes into contact with each other.

Further, a second semiconductor device of the present invention includes a plurality of the above-described semiconductor packages. The plurality of semiconductor packages are connected electrically by disposing the first side external electrode or the second side external electrode of one of the plurality of semiconductor packages so as to be in contact with the first side external electrode or the second side external electrode of another semiconductor package.

According to the present invention, by forming the sidewall external electrode that is connected to the connection wiring, an area for providing electrodes is increased. Therefore, it is possible to suppress the semiconductor package from being large even when the number of electrodes is increased. Further, by bringing the sidewall external electrodes or the side external electrodes into contact with each other, the semiconductor package can be connected electrically to another semiconductor package without using the substrate on which the semiconductor package is mounted. Therefore, it is possible to shorten a connection distance between the semiconductor packages.

The semiconductor package of the present invention can adopt the following various modes based on the above-described configurations. Specifically, in the first semiconductor package of the present invention, the connection wiring may be laid on a surface of the substrate and inside the substrate in directions perpendicular and parallel to a plane of the substrate, exposed from the substrate, and contact with the inner electrode.

Further, the sidewall external electrode may be positioned so as to be connectable to a sidewall external electrode of another semiconductor package. With this configuration, the semiconductor packages can be connected to each other without matching the height of the semiconductor packages, which reduces the number of times of machining the semiconductor packages.

Further, the semiconductor package may be configured so that not all of the sidewalls include the inner electrode and the sidewall external electrode.

Further, the semiconductor package may be configured so that a plurality of the sidewall external electrodes are formed in a direction perpendicular to a plane of the substrate, the adjacent sidewall external electrodes do not contact with each other, and a length of the sidewall in a direction along the substrate is the same as or longer than a length of a side of the substrate in contact with the sidewall. With this configuration, the number of the sidewall external electrodes can be increased.

Further, the number of the sidewall external electrodes may be equal to or less than the number of the inner electrodes connected to the connection wiring.

Further, the semiconductor package further may include a lid that is disposed on the sidewall or the semiconductor chip, and the semiconductor chip is sealed by the substrate, the sidewall and the lid.

Further, the semiconductor package further may include a mold resin that is poured into a region surrounded by the substrate and the sidewall, and the semiconductor chip is sealed by the mold resin.

Further, the connection wiring may be formed of an inner lead. With this configuration, the connection wiring can be connected to the sidewall external electrode using a low-cost material.

Furthermore, in the second semiconductor package of the present invention, the first electrical passage and the second electrical passage may be a transmission path of a signal output from the semiconductor chip.

Furthermore, the semiconductor package further may include a plurality of ball electrodes that are connected to the back surface wiring layer on the back surface of the wiring substrate. The first electrical passage is connected to a first ball electrode among the plurality of ball electrodes via the back surface wiring layer, and the second electrical passage is connected to a second ball electrode among the plurality of ball electrodes via the back surface wiring layer.

Embodiment 1

Figure 1B:
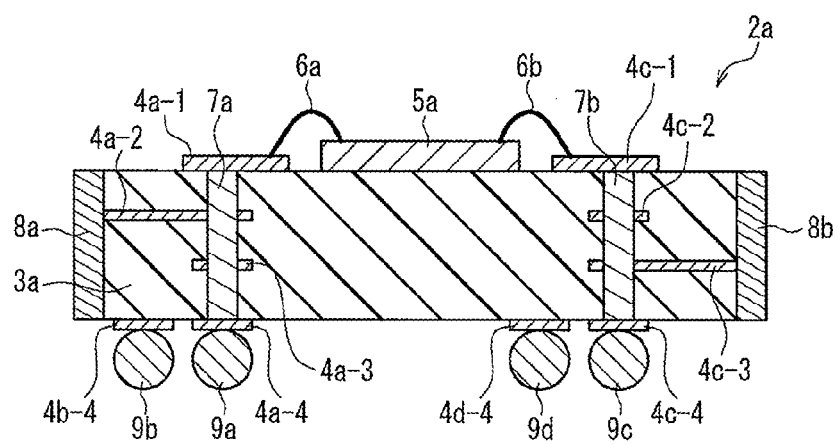
FIG. 1B is a cross-sectional view taken along a line A-A in FIG. 1A.

FIG. 1A is a perspective view showing a configuration of a semiconductor package $2a$ according to Embodiment 1 of the present invention. FIG. 1B is a cross-sectional view taken along a line A-A in FIG. 1A.

As shown in FIG. 1B, four layers of electrical passages $4a$-1 to $4a$-4 are stacked in a substrate $3a$. Each of the electrical passages $4a$-1 to $4a$-4 is formed by patterning. A semiconductor chip $5a$ is disposed on the substrate $3a$. A wire $6a$ connects the semiconductor chip $5a$ and the first layer of the electrical passage $4a$-1. A via $7a$ is formed in the substrate $3a$. The via $7a$ passing through the substrate $3a$ connects each of the electrical passages $4a$-1 to $4a$-4.

A side external electrode $8a$ is formed on a side surface of the substrate $3a$. The side external electrode $8a$ is connected to the second layer of the electrical passage $4a$-2. Thereby, a signal output from the semiconductor chip $5a$ is transmitted to the surface layer of the electrical passage $4a$-1 via the wire $6a$, and then transmitted to the side external electrode $8a$ via the via $7a$ and the second layer of the electrical passage $4a$-2.

A conductive ball $9a$ is formed on the fourth layer of the electrical passage $4a$-4. Similarly, conductive balls $9b$, $9d$ respectively are formed on the fourth layer of the electrical passages $4b$-4, $4d$-4 that are connected to other vias (not shown) connected to the semiconductor chip $5a$.

Further, electrical passages $4c$-1 to $4c$-4 and a via $7b$ passing through the substrate $3a$ are formed in the substrate $3a$. A wire $6b$ connects the semiconductor chip $5a$ to the electrical passage $4c$-1. The electrical passage $4c$-1 is connected to the via $7b$ connected to each of the electrical passages $4c$-2 to $4c$-4. The third layer of the electrical passage $4c$-3 is connected to a side external electrode $8b$. A conductive ball $9c$ is formed on the fourth layer of the electrical passage $4c$-4. The balls $9a$ to $9d$ are connected to electrodes of a substrate (not shown).

Figure 2:
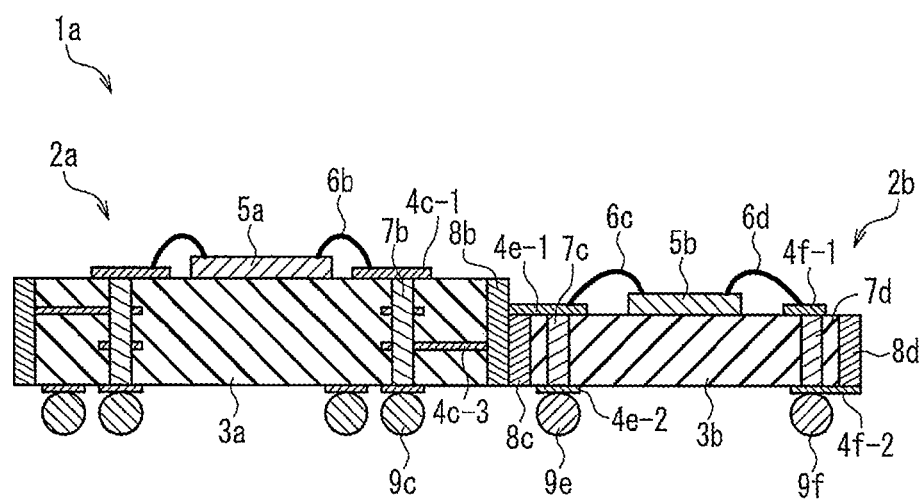
FIG. 2 is a cross-sectional view showing a configuration of a semiconductor device according to Embodiment 1.

FIG. 2 is a cross-sectional view showing a configuration of a semiconductor device $1a$ that is configured by bringing the side external electrodes $8b$, $8c$ of the semiconductor packages $2a$, $2b$ according to the present embodiment into contact with each other.

In the semiconductor package $2b$, two layers of electrical passages $4e$, $4f$ are stacked in a substrate $3b$. Each of the electrical passages $4e$, $4f$ is formed by patterning. A semiconductor chip $5b$ is disposed on the substrate $3b$. Wires $6c$, $6d$ connect the semiconductor chip $5b$ to the electrical passages $4e$-1, $4f$-1, respectively. Vias $7c$ and $7d$ pass through the substrate $3b$ for connecting the electrical passages $4e$-1, $4e$-2 and the electrical passages $4f$-1, $4f$-2, respectively.

The side external electrodes $8c$, $8d$ are formed on side surfaces of the substrate $3b$. The side external electrodes $8c$, $8d$ are connected to the electrical passages $4e$-1, $4f$-2, respectively. Conductive balls $9e$, $9f$ are formed on the second layer of the electrical passages $4e$-2, $4f$-2, respectively. Note here that the balls $9e$, $9f$ are connected to electrodes of the substrate (not shown).

The semiconductor package $2a$ and the semiconductor package $2b$ are connected electrically by bringing the side external electrode $8b$ and the side external electrode $8c$ into contact with each other.

With this configuration, a signal output from the semiconductor chip $5a$ is transmitted to the semiconductor chip $5b$ via the wire $6b$, the electrical passage $4c$-1, the via $7b$, the electrical passage $4c$-3, the side external electrode $8b$, the side external electrode 8c, the electrical passage 4e-1 and the wire 6c. Thus, as compared with a conventional signal path in which a signal is transmitted between the semiconductor chip 5a and the semiconductor chip 5b by causing the signal to pass from the ball 9c of the semiconductor package 2a to the ball 9e of the semiconductor package 2b via the substrate (not shown), it is possible to shorten the transmission path.

Figure 3A:
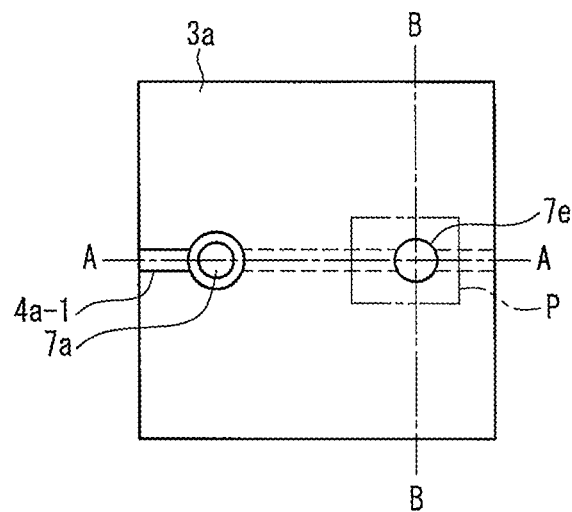
FIG. 3A is a partial top view showing the process of forming a side external electrode on a substrate of the semiconductor package according to Embodiment 1.

Next, a method of forming the side external electrode of the semiconductor package 2a according to the present embodiment will be described. FIG. 3A is a partial top view showing the process of forming the side external electrode on the substrate 3a. A line B-B in FIG. 3A indicates a position to be cut in the later process.

Figure 3B:
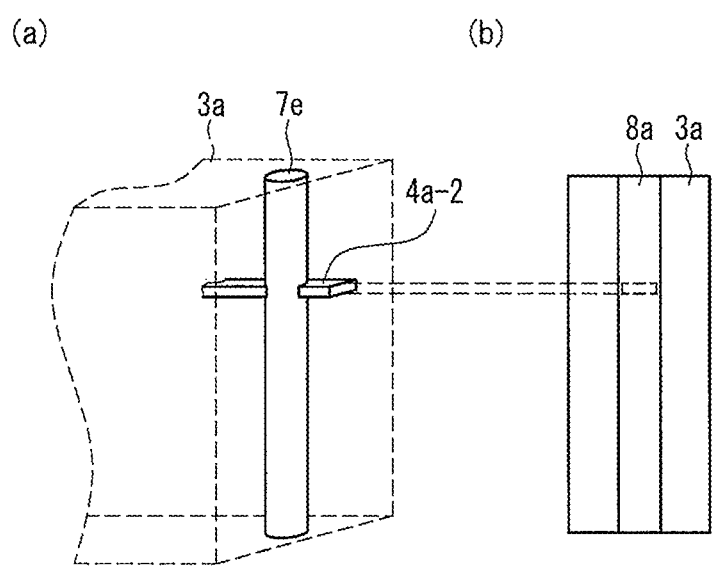
FIG. 3B(a) is a perspective view showing a configuration of the substrate in the state shown in FIG. 3A, and FIG. 3B(b) is a cross-sectional view taken along a line B-B in FIG. 3A.

In the formation of the side external electrode 8a, first, a via 7e is formed on the cutting line (line B-B) of the substrate 3a. FIG. 3B(a) is a perspective view showing a region P in FIG. 3A. For the sake of clarity, only the via 7e and the electrical passage 4a-2 are illustrated. The via 7e is connected to the second layer of the electrical passage 4a-2. Next, the substrate 3a is cut along the line B-B. That is, the substrate 3a is cut so that the via 7e is exposed in the side surface of the substrate 3a. FIG. 3B(b) is a cross-sectional view taken along the line B-B in FIG. 3A. The exposed via 7e serves as the side external electrode 8a.

In the above-described manner, the side external electrode 8a of the semiconductor package 2a is formed. In order to expose the via 7e, the above description explains the case where the substrate 3a is cut along the line B-B in FIG. 3A. However, the via may be exposed by another method, such as grinding.

According to the semiconductor package 2a of the present embodiment configured as above, it is possible to newly provide side external electrodes on the side surfaces of the substrate 3a on which the semiconductor chip 5a is mounted, whereby the number of electrodes can be increased without changing the size of the semiconductor package.

Further, by bringing the side external electrodes 8b, 8c of the adjacent semiconductor packages 2a, 2b into contact with each other, it is possible to shorten the transmission path as compared with the conventional case of transmitting a signal between semiconductor packages via balls formed on back surfaces of the semiconductor packages.

Note here that it is unnecessary to form the side external electrodes on all of the four side surfaces of the substrate.

Embodiment 2

Figure 4A:
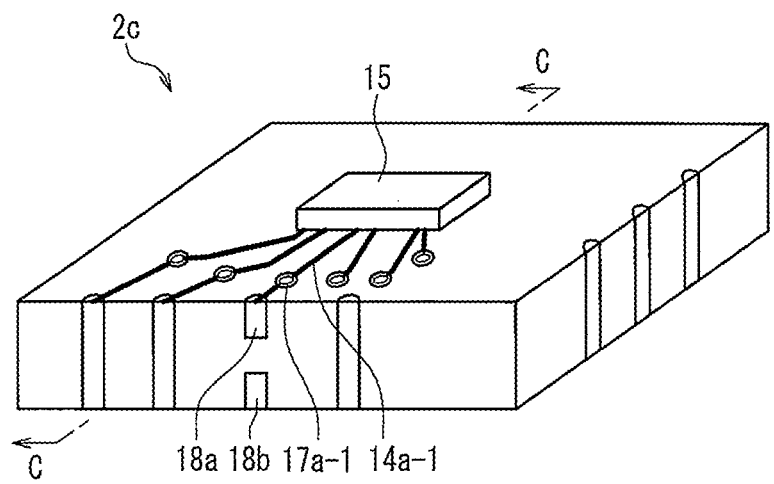
FIG. 4A is a perspective view showing a configuration of a semiconductor package according to Embodiment 2.
Figure 4B:
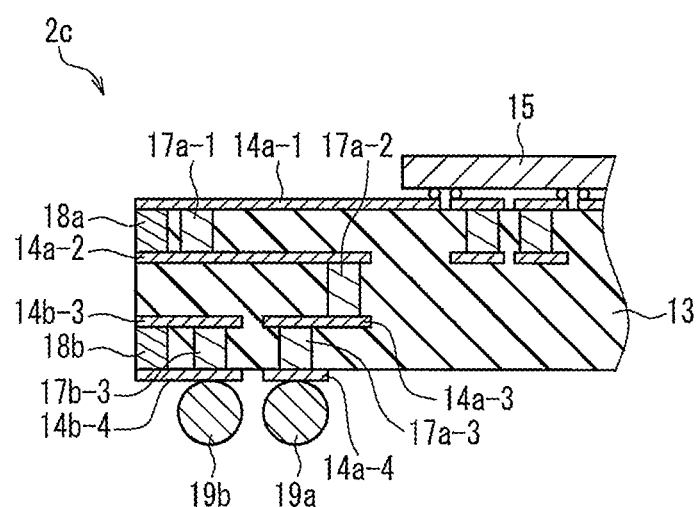
FIG. 4B is a partial cross-sectional view taken along a line C-C in FIG. 4A.

FIG. 4A is a perspective view showing a configuration of a semiconductor package 2c according to Embodiment 2 of the present invention. FIG. 4B is a partial cross-sectional view taken along a line C-C in FIG. 4A.

A substrate 13 has a configuration in which four layers of electrical passages 14a-1 to 14a-4 are stacked. Each of the electrical passages is formed by patterning. A semiconductor chip 15 is disposed on the substrate 13 so that a terminal surface of the semiconductor chip 15 is connected to the substrate (face down). Vias 17a-1 to 17a-3 are formed in the substrate 13.

The via 17a-1 connects the first layer of the electrical passage 14a-1 and the second layer of the electrical passage 14a-2. The via 17a-2 connects the second layer of the electrical passage 14a-2 and the third layer of the electrical passage 14a-3. The via 17a-3 connects the third layer of the electrical passage 14a-3 and the fourth layer of the electrical passage 14a-4.

A side external electrode 18a is formed on a side surface of the substrate 13. The side external electrode 18a is connected to the first layer of the electrical passage 14a-1 and the second layer of the electrical passage 14a-2. Thereby, a signal output from the semiconductor chip 15 is transmitted to the side external electrode 18a from the surface layer of the electrical passage 14a-1, or transmitted via the electrical passage 14a-1, the via 17a-1 and the second layer of the electrical passage 14a-2. A conductive ball 19a is formed on the fourth layer of the electrical passage 14a-4.

The third layer of an electrical passage 14b-3, which is connected to another via (not shown) connected to the semiconductor chip 15, is connected to a side external electrode 18b formed on the side surface of the substrate 13. The third layer of an electrical passage 14b-3 is connected to the fourth layer of an electrical passage 14b-4 via a via 17b-3 and the side external electrode 18b. A conductive ball 19b is formed on the fourth layer of the electrical passage 14b-4. The balls 19a, 19b are connected to a substrate (not shown).

Figure 5A:
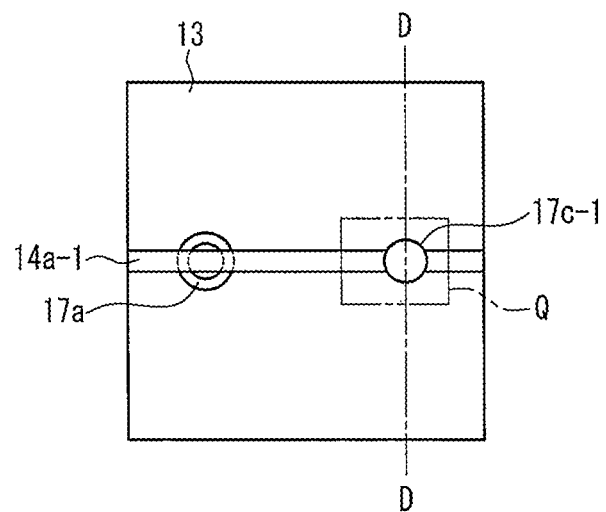
FIG. 5A is a partial top view showing the process of forming a side external electrode on a substrate of the semiconductor package according to Embodiment 2.

Next, a method of forming the side external electrode of the semiconductor package according to the present embodiment will be described. FIG. 5A is a top view showing the process of forming the side external electrodes 18a, 18b on the substrate 13 shown in FIG. 4A. A line D-D in FIG. 5A indicates a position to be cut in the later process.

Figure 5B:
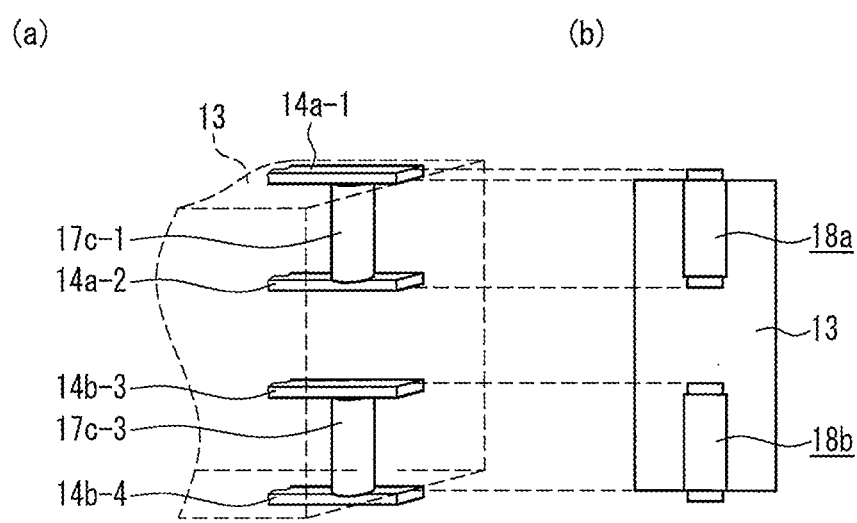
FIG. 5B(a) is a perspective view showing a configuration of the substrate in the state shown in FIG. 5A, and FIG. 5B(b) is a cross-sectional view taken along a line D-D in FIG. 5A.

In the formation of the side external electrodes 18a, 18b, first, vias 17c-1, 17c-3 shown in FIG. 5B(a) are formed on the cutting line (line D-D) of the substrate 13. FIG. 5B(a) is a perspective view showing a region Q in FIG. 5A. For the sake of clarity, only the vias 17c-1, 17c-3 and the electrical passages 14a-1, 14a-2, 14b-3, 14b-4 are illustrated. The via 17c-1 connects the first layer of the electrical passage 14a-1 and the second layer of the electrical passage 14a-2. The via 17c-3 connects the third layer of the electrical passage 14b-3 and the fourth layer of the electrical passage 14b-4.

Next, the substrate 13 is cut along the line D-D. That is, the substrate 13 is cut so that the vias 17c-1, 17c-3 are exposed in the side surface of the substrate 13. FIG. 5B(b) is a cross-sectional view taken along the line D-D in FIG. 5A. The exposed via 17c-1 and the electrical passages 14a-1, 14a-2 serve as the side external electrode 18a. The exposed via 17c-3 and the electrical passages 14b-3, 14b-4 serve as the side external electrode 18b. In the above-described manner, the side external electrodes 18a, 18b of the semiconductor package 2c are formed.

According to the semiconductor package of the present embodiment configured as above, by providing the side surfaces of the substrate with the side external electrodes, it is possible to newly provide electrodes on the side surfaces of the substrate on which the semiconductor chip is mounted. Thereby, the number of electrodes can be increased without changing the size of the semiconductor package.

Further, by bringing the side external electrodes of the adjacent semiconductor packages into contact with each other, in the case of configuring the semiconductor device, it is possible to shorten the transmission path as compared with the conventional case of transmitting a signal between semiconductor packages via balls formed on back surfaces of the semiconductor packages.

Further, by disposing a plurality of side external electrodes in the upper and lower directions of the side surfaces of the substrate and causing them to output different signals, it is possible to reduce an area in the side surfaces that is required for placing the electrodes, as compared with the semiconductor package according to Embodiment 1. Thereby, the semiconductor package can be made compact, or can include a larger number of electrodes with the same volume.

Embodiment 3

Figure 6A:
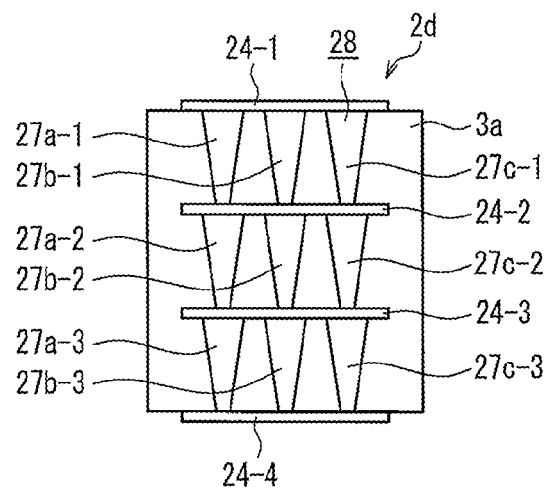
FIG. 6A is a side view showing a configuration of a semiconductor package according to Embodiment 3.

FIG. 6A is a side view showing a configuration of a semiconductor package 2d according to Embodiment 3 of the present invention. The semiconductor package 2*d* according to the present embodiment is the same as the semiconductor package 2*a* according to Embodiment 1, except for the configuration in the vicinity of the side external electrode. In the semiconductor package 2*d* according to the present embodiment, the same constituent elements as those in the semiconductor package 2*a* according to Embodiment 1 are denoted with the same reference numerals, and the explanation will not be repeated.

A side external electrode 28 is formed of four layers of electrical passages 24-1 to 24-4, and cut vias 27*a*-1 to 27*c*-1, 27*a*-2 to 27*c*-2, 27*a*-3 to 27*c*-3 having tapered shapes.

Figure 6B:
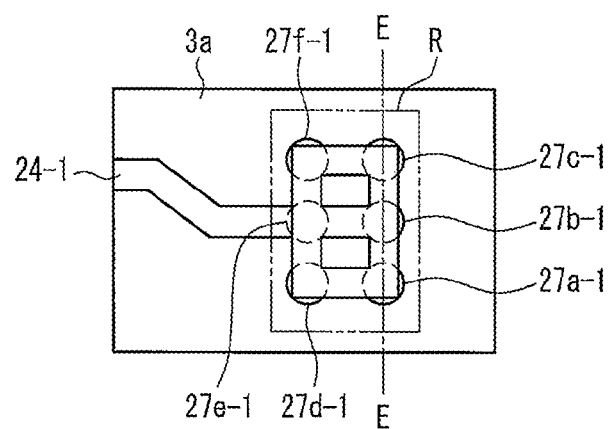
FIG. 6B is a partial top view showing the process of forming a side external electrode on a substrate of the semiconductor package according to Embodiment 3.
Figure 6C:
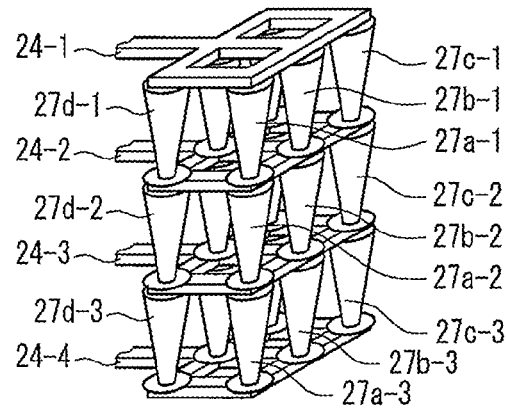
FIG. 6C is a perspective view showing a configuration of the side external electrode in the state shown in FIG. 6B.

FIG. 6B is a top view showing the process of forming the side external electrode. A line E-E in FIG. 6B indicates a position to be cut in the later process. FIG. 6C is a perspective view showing a region R in FIG. 6B. For the sake of clarity, only the vias 27*a*-1 to 27*f*-1, 27*a*-2 to 27*f*-2, 27*a*-3 to 27*f*-3 (some of the reference numerals are omitted in FIG. 6C) and the electrical passages 24-1 to 24-4 are illustrated.

In the process of manufacturing the substrate, the tapered vias 27*a*-1 to 27*f*-1, 27*a*-2 to 27*f*-2, 27*a*-3 to 27*f*-3 and the electrical passages 24-1 to 24-4 are formed in the substrate 3*a*. The six vias 27*a*-1 to 27*f*-1 connect the electrical passage 24-1 and the electrical passage 24-2 electrically. The six vias 27*a*-2 to 27*f*-2 connect the electrical passage 24-2 and the electrical passage 24-3 electrically. The six vias 27*a*-3 to 27*f*-3 connect the electrical passage 24-3 and the electrical passage 24-4 electrically. The vias 27*a*-1 to 27*c*-1, 27*a*-2 to 27*c*-2, 27*a*-3 to 27*c*-3 are disposed on the line E-E.

By cutting the substrate 3*a* along the line E-E in this state, the vias 27*a*-1 to 27*c*-1, 27*a*-2 to 27*c*-2, 27*a*-3 to 27*c*-3 and the electrical passages 24-1 to 24-4 are cut as shown in FIG. 6A, thereby being exposed on the side surface of the substrate and serving as the side external electrode 28.

In the above-described manner, as a particular effect of the present embodiment, large side external electrodes can be placed. Thereby, even when semiconductor packages with the side external electrode are misaligned in the connection, it is possible to maintain the electrical connection state.

Further, by providing the substrate 3*a* with the vias 27*d*-1 to 27*f*-1, 27*d*-2 to 27*f*-2, 27*d*-3 to 27*f*-3 that are not disposed on the line E-E in FIG. 6B, even when the substrate 3*a* is cut slightly out of angle from the direction perpendicular to the line E-E, the side external electrode 28 can be formed when these vias are cut.

Embodiment 4

Figure 7A:
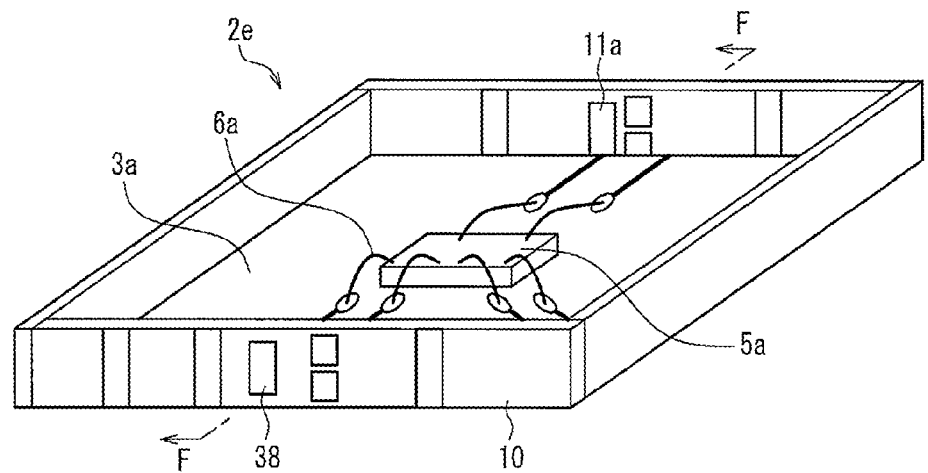
FIG. 7A is a perspective view showing a configuration of a semiconductor package according to Embodiment 4.

FIG. 7A is a perspective view showing a configuration of a semiconductor package 2*e* according to Embodiment 4 of the present invention. The semiconductor package 2*e* according to the present embodiment has a configuration in which sidewalls 10 are provided around the side surfaces of the semiconductor package 2*a* according to Embodiment 1. In the semiconductor package according to the present embodiment, the same constituent elements as those in the semiconductor package 2*a* according to Embodiment 1 are denoted with the same reference numerals, and the explanation will not be repeated.

Figure 7B:
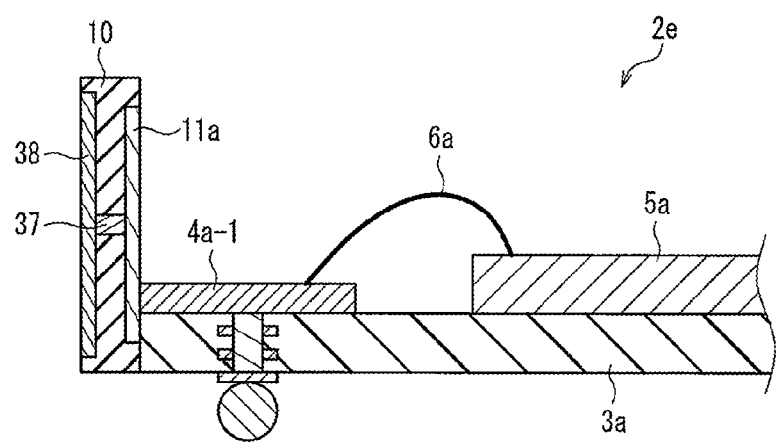
FIG. 7B is a partial cross-sectional view taken along a line F-F in FIG. 7A.

FIG. 7B is a cross-sectional view of the semiconductor package 2*e* taken along a line F-F in FIG. 7A. The sidewalls 10 are connected to the four side surfaces of the substrate 3*a*. The sidewall 10 is formed of an insulator. The sidewall 10 includes an inner electrode 11*a* that is formed on an inner surface of the sidewall 10 that faces the substrate 3*a* and connected to the side surface of the substrate 3*a*, a sidewall external electrode 38 that is formed on an outer side of the wall surface, and a via 37 that connects the inner electrode 11*a* and the sidewall external electrode 38 electrically. The inner electrode 11*a* and the sidewall external electrode 38 are formed by patterning.

The first layer of the electrical passage 4*a*-1 that is connected to the semiconductor chip 5*a* by the wire 6*a* is connected to the inner electrode 11*a*. Thereby, the semiconductor chip 5*a* and the sidewall external electrode 38 are connected electrically.

Figure 8:
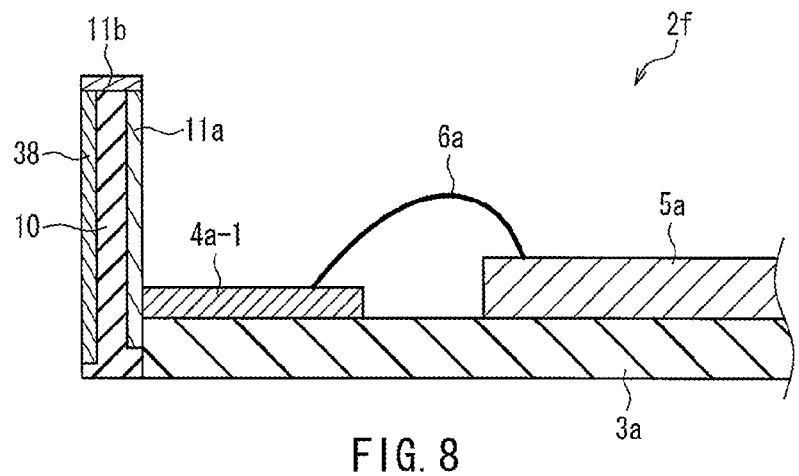
FIG. 8 is a partial cross-sectional view showing a configuration of a semiconductor package according to Embodiment 4 different from the semiconductor package shown in FIG. 7A.

In the configuration shown in FIG. 7B, although the via 37 is used for electrically connecting the sidewall external electrode 38 and the inner electrode 11*a*, the present embodiment is not limited to this configuration. For example, as shown in FIG. 8, the sidewall external electrode 38 and the inner electrode 11*a* can be connected electrically by forming a conductive portion 11*b* on the top of the sidewall 10.

Figure 9:
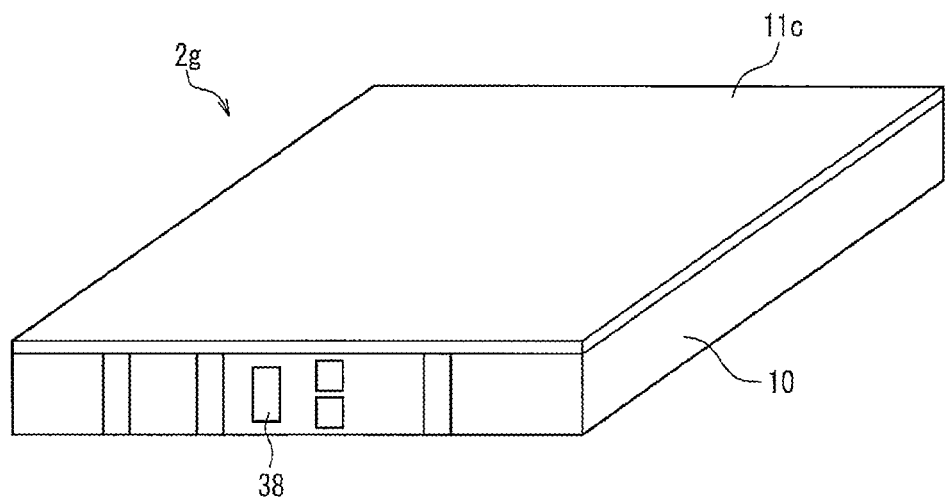
FIG. 9 is a perspective view showing a configuration of a semiconductor package according to Embodiment 4 different from the semiconductor package shown in FIG. 7A.

FIG. 9 is a perspective view showing another configuration of a semiconductor package according to the present embodiment. A semiconductor package 2*g* according to the present embodiment is the same as the semiconductor package 2*e*, except that a lid 11*c* is provided on the upper surfaces of the sidewalls to hide the semiconductor chip. With this configuration, it is possible easily to form the semiconductor package in which the semiconductor chip 5*a* is sealed by the sidewalls 10, the substrate 3*a*, and the lid 11*c*.

Further, the semiconductor package can be formed by pouring a mold resin for sealing the semiconductor chip 5*a*, onto the substrate 3*a* surrounded by the four sidewalls 10 shown in FIG. 7A. At the time of pouring the mold resin, the sidewalls can be used as prevention walls for preventing a resin from being leaked, thereby facilitating the process of forming the semiconductor package. Therefore, in the case of using the sidewalls as the prevention walls, not all of the sidewalls, arranged around the four side surfaces of the substrate, need to include the inner electrode and the sidewall external electrode.

According to the semiconductor package of the present embodiment configured as above, electrodes can be provided on the sidewalls, and the number of electrodes can be increased without changing the size of the semiconductor package.

Further, as long as the electrical passage 4*a*-1 is connected to the inner electrode 11*a*, it is unnecessary to form the side external electrodes on the side surfaces of the substrate 3*a*. Therefore, it is possible to form the sidewall external electrode 38 in the semiconductor package 2*e* without the necessity of machining the substrate on which the semiconductor chip 5*a* is mounted.

Further, the sidewall external electrode can be formed on the sidewalls without depending on the thickness of the substrate as compared with the semiconductor packages of Embodiments 1-3. Therefore, the number of the sidewall external electrodes in the semiconductor package can be increased beyond the number of the side external electrodes provided on the side surfaces of the substrate.

Further, since the sidewall external electrode and the inner electrode are formed by patterning, they can be formed into desired shapes. Therefore, in the case of bringing the sidewall external electrodes of the semiconductor packages into contact with each other, the height of the semiconductor packages need not be matched if the sidewall external electrodes are formed at positions corresponding to each other. Thereby, it is possible to reduce the number of times of machining the semiconductor packages.

Further, a plurality of the sidewall external electrodes can be formed in the direction perpendicular to the substrate plane, and the adjacent sidewall external electrodes can be configured not to contact with each other. With this configuration, a larger number of the sidewall external electrode can be provided.

Further, the height of the sidewall can be determined arbitrarily. With this configuration, the number and the size of the sidewall external electrode can be determined more flexibly.

The length of the sidewall may be the same as or longer than the length of the side of the substrate in contact with the sidewall. Further, by surrounding the four sides of the substrate with the sidewalls, the sidewalls function as prevention walls preventing a mold resin from being leaked.

Figure 10A:
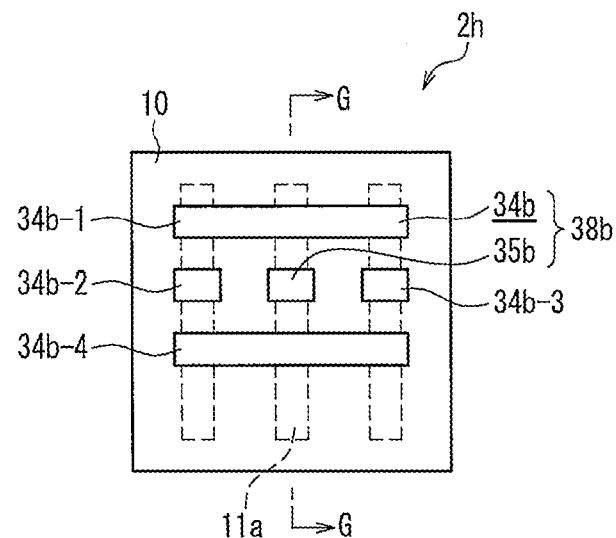
FIG. 10A is a view showing configurations of a sidewall external electrode and an inner electrode in a first modification example of the semiconductor package according to Embodiment 4.
Figure 10B:
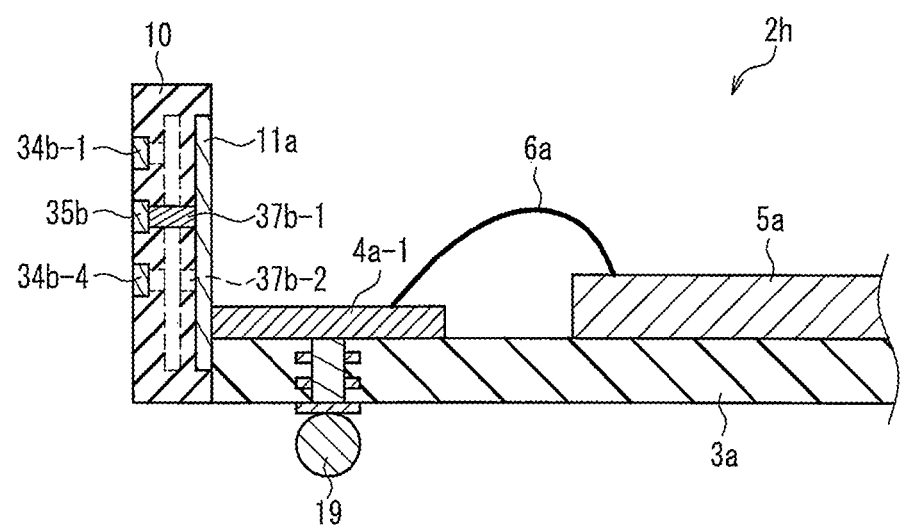
FIG. 10B is a partial cross-sectional view taken along a line G-G in FIG. 10A.

Further, the sidewall external electrode to be formed on the sidewall can adopt various modes. A semiconductor package 2h shown in FIGS. 10A, 10B is a first modification example of the semiconductor package 2e shown in FIG. 7A. FIG. 10A is a side view showing a configuration of a sidewall external electrode of the semiconductor package 2h. FIG. 10B is a partial cross-sectional view taken along a line G-G in FIG. 10A.

A sidewall external electrode 38b includes a signal electrode 35b, and a ground electrode 34b that is disposed so as to surround the signal electrode 35b. The ground electrode 34b is composed of ground lines 34b-1 to 34b-4. The signal electrode 35b is connected to the semiconductor chip 5a via a via 37b-1, the inner electrode 11a, the electrical passage 4a-1 and the wire 6a. Although not illustrated in FIG. 10B, the ground electrode 34b is connected, via a via 37h-2 and an inner electrode for grounding, to a ground that is connected to the semiconductor chip 5a or the ball 19.

The above-described configuration also can provide the same effect as that of the configuration shown in FIG. 7A. Further, in the configuration of the present modification example, since the signal electrode 35b is surrounded by the ground electrode 34b, it is possible to reduce an influence on the signal electrode 35b exerted by noise, etc., generated from signal lines or the like arranged adjacent or around the signal electrode 35b.

Figure 11A:
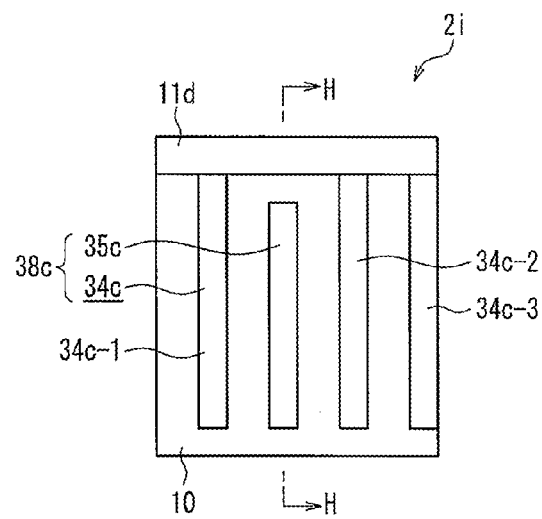
FIG. 11A is a view showing configurations of a sidewall external electrode and an inner electrode in a second modification example of the semiconductor package according to Embodiment 4.
Figure 11B:
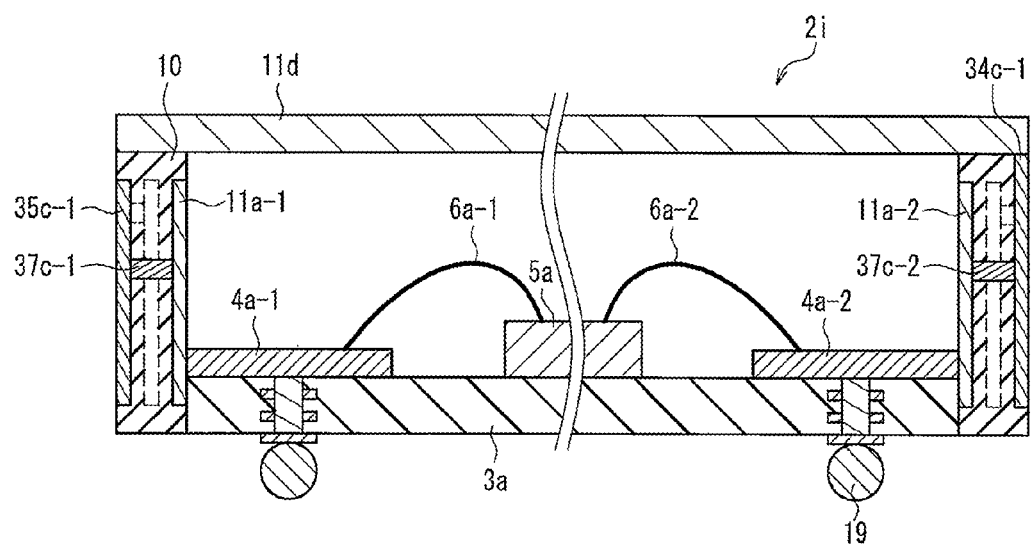
FIG. 11B is a cross-sectional view taken along a line H-H in FIG. 11A.

Further, a semiconductor package 2i shown in FIGS. 11A, 11B is a second modification example of the semiconductor package 2e shown in FIG. 7A. FIG. 11A is a side view showing a configuration of a sidewall external electrode of the semiconductor package 2i. FIG. 11B is a cross-sectional view taken along a line H-H in FIG. 11A.

A sidewall external electrode 38c includes a signal electrode 35c, and ground electrodes 34c disposed so as to sandwich the signal electrode 35c. The ground electrode 34c is composed of ground lines 34c-1 to 34c-3 having shapes whose upper and lower directions are the longitudinal direction. The signal electrode 35c is connected to the semiconductor chip 5a via a via 37c-1, an inner electrode 11a-1, the electrical passage 4a-1 and a wire 6a-1. The ground line 34c-1 is connected to the semiconductor chip 5a via a via 37c-2, an inner electrode 11a-2, an electrical passage 4a-2 and a wire 6a-2. Further, the ground line 34c-1 may be connected to a ground that is connected to the ball 19 via the via 37c-2, the inner electrode 11a-2 and the electrical passage 4a-2.

A lid 11d formed of a conductive material is disposed on the sidewalls 10, and connected to the ground lines 34c-1 to 34c-3.

The above-described configuration also can provide the same effect as that of the configuration shown in FIG. 7A. Further, in the configuration of the present modification example, the ground lines 34c-1 to 34c-3 are disposed in the right and left directions of the signal electrode 35c, and the lid 11d that is connected to the ground line 34c-1 is disposed on the upper portion of the sidewall 10. With this configuration, it is possible to reduce an influence on the signal electrode exerted by radiation noise, etc., generated during the operation of the semiconductor chip, or noise, etc., from other components arranged around the semiconductor package.

Figure 12:
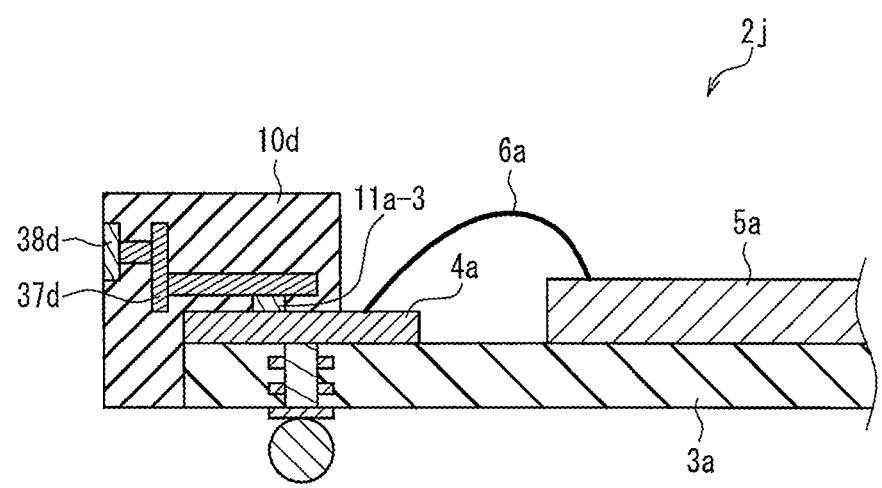
FIG. 12 is a partial cross-sectional view showing configurations of a sidewall external electrode and an inner electrode in a third modification example of the semiconductor package according to Embodiment 4.

Further, a semiconductor package 2j shown in FIG. 12 is a third modification example of the semiconductor package 2e shown in FIG. 7A. FIG. 12 is a cross-sectional view of the semiconductor package 2j.

Part of a sidewall 10d is placed on the substrate 3a and an electrical passage 4a. An inner electrode 11a-3 has a main surface formed in the same direction as a main surface of the substrate 3a, and is connected to the electrical passage 4a. A sidewall external electrode 38d is connected to the semiconductor chip 5a via a via 37d, the inner electrode 11a-3, the electrical passage 4a and the wire 6a.

The above-described configuration also can provide the same effect as that of the configuration shown in FIG. 7A. Further, in the configuration of the present modification example, since part of the sidewall 10d is placed on the substrate 3a and the electrical passage 4a, a large contact area can be secured between the substrate 3a and the sidewall 10d. Thereby, the sidewall 10d can be connected to the substrate 3a easily.

Figure 13A:
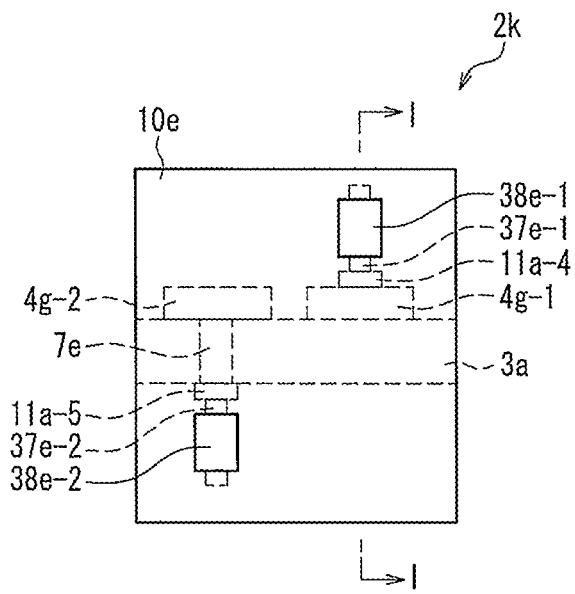
FIG. 13A is a view showing configurations of a sidewall external electrode and an inner electrode in a fourth modification example of the semiconductor package according to Embodiment 4.
Figure 13B:
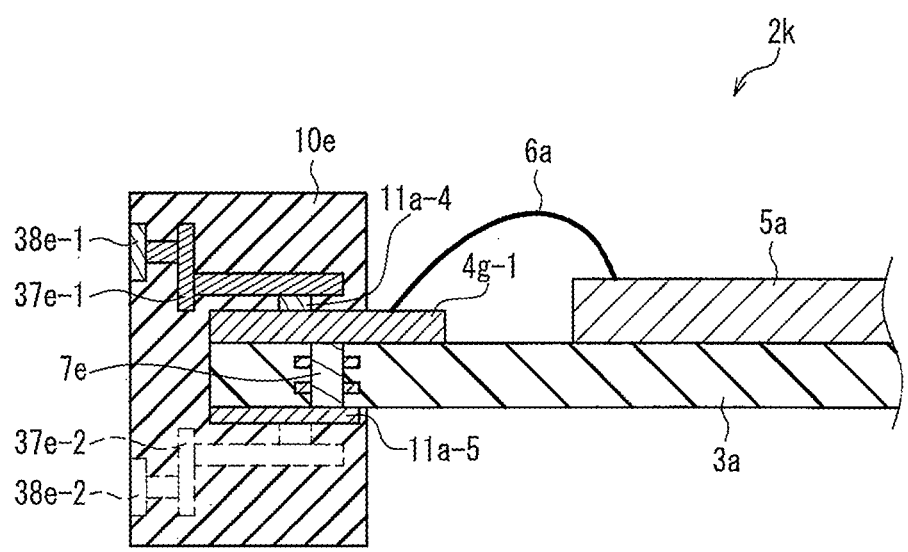
FIG. 13B is a partial cross-sectional view taken along a line I-I in FIG. 13A.

Further, a semiconductor package 2k shown in FIGS. 13A, 13B is a fourth modification example of the semiconductor package 2e shown in FIG. 7A. FIG. 13A is a side view showing a configuration of a sidewall external electrode of the semiconductor package 2k. FIG. 13B is a cross-sectional view taken along a line I-I in FIG. 13A.

A sidewall 10e is arranged so as to contact with the side surfaces and the upper and lower surfaces of the substrate 3a. An electrical passage 4g-1 is connected to the semiconductor chip 5a via the wire 6a. Further, the electrical passage 4g-1 is connected to a sidewall external electrode 38e-1 via an inner electrode 11a-4 and a via 37e-1. In other words, the sidewall external electrode 38e-1 is connected to the semiconductor chip 5a electrically.

Although not illustrated, an electrical passage 4g-2 is connected to the semiconductor chip 5a via a wire. Further, the electrical passage 4g-2 is connected to a sidewall external electrode 38e-2 via a via 7e, an inner electrode 11a-5 and a via 37e-2. In other words, the sidewall external electrode 38e-2 is connected to the semiconductor chip 5a electrically.

The above-described configuration also can provide the same effect as that of the configuration shown in FIG. 7A. Further, in the configuration of the present modification example, since the sidewall 10e is arranged so as to contact with the side surfaces and the upper and lower surfaces of the substrate 3a, a large contact area can be secured between the substrate 3a and the sidewall 10e. Thereby, the sidewall 10e can be connected to the substrate 3a easily. Moreover, since the large contact area between the substrate 3a and the sidewall 10e can be secured, the number of the contact point between the electrical passage and the inner electrode is increased accordingly, which makes it possible to increase the number of the sidewall external electrodes.

Figure 14:
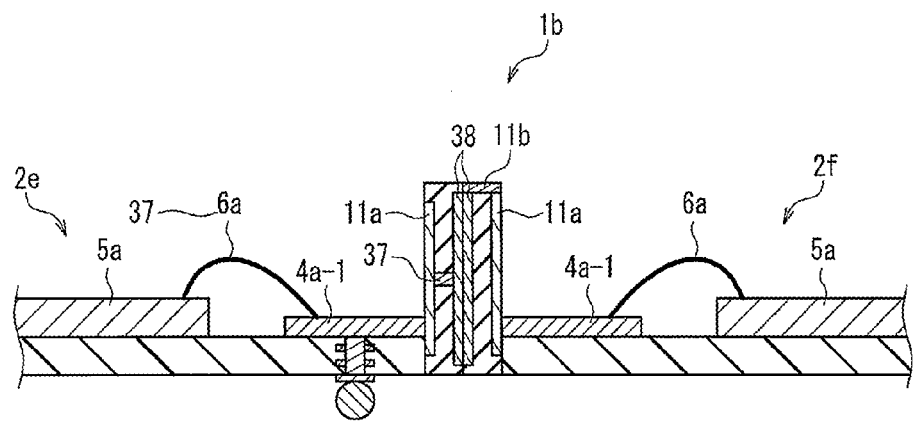
FIG. 14 is a cross-sectional view showing a configuration of a semiconductor device according to Embodiment 4.

FIG. 14 is a cross-sectional view showing a configuration of a semiconductor device 1b in which the semiconductor packages 2e shown in FIG. 7B and the semiconductor package 2f shown in FIG. 8 are connected electrically. The sidewall external electrode 38 of the semiconductor package 2e and the sidewall external electrode 38 of the semiconductor package 2f are connected directly, which allows input/output signals of the semiconductor chip 5a of the semiconductor package 2e to propagate to the semiconductor chip 5a of the semiconductor package 2f without passing a substrate (not shown). Thus, the propagation path can be shortened between the semiconductor chips.

Embodiment 5

Figure 15A:
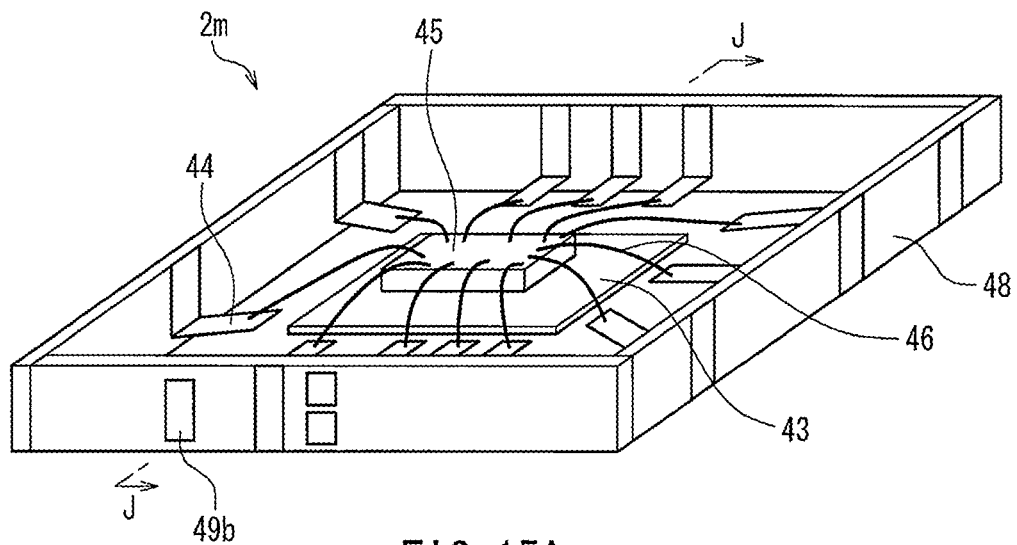
FIG. 15A is a perspective view showing a configuration of a semiconductor package according to Embodiment 5.
Figure 15B:
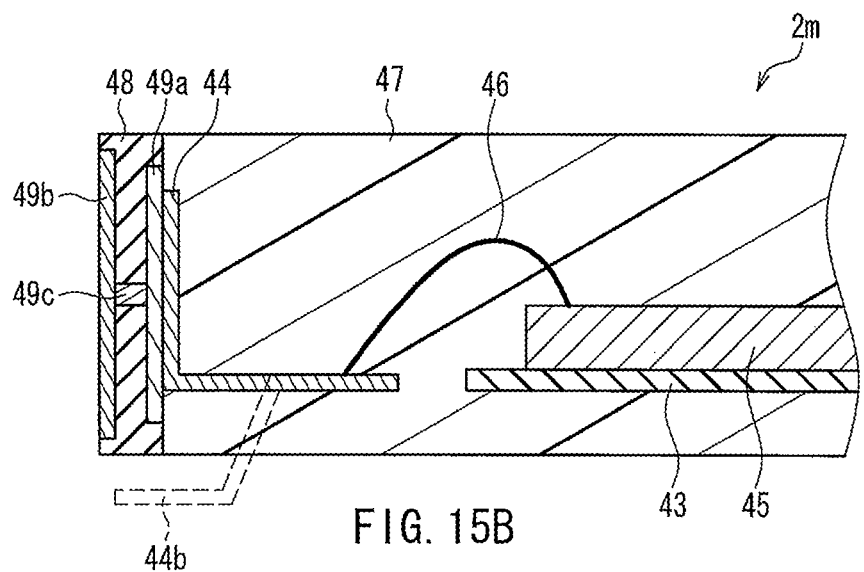
FIG. 15B is a partial cross-sectional view taken along a line J-J in FIG. 15A.
Figure 16:
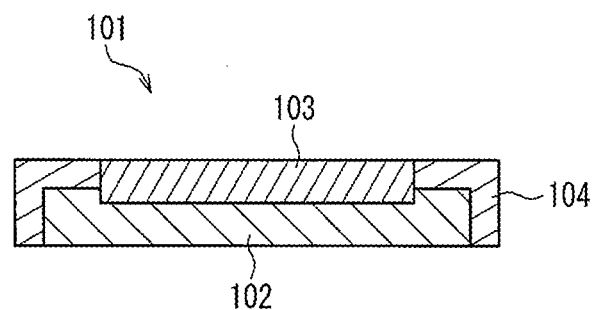
FIG. 16 is a cross-sectional view showing a configuration of a conventional semiconductor chip.
Figure 17:
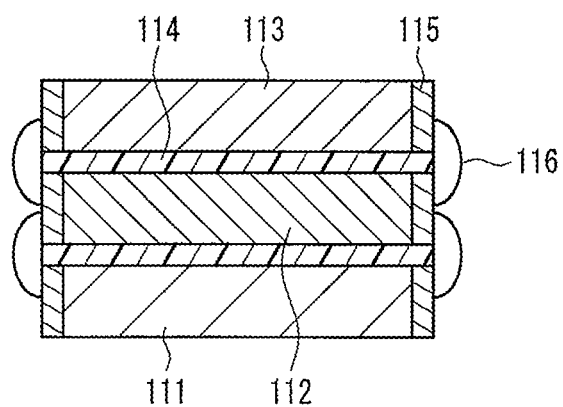
FIG. 17 is a cross-sectional view showing another configuration of a conventional semiconductor chip.

FIG. 15A is a perspective view showing a configuration of a semiconductor package 2m according to Embodiment 5 of the present invention. FIG. 15B is a cross-sectional view of the semiconductor package 2m taken along a line J-J in FIG. 15A. The semiconductor package 2m is a lead-frame package using a lead frame. In FIG. 15A, for the sake of clarity, the illustration of a resin 47 shown in FIG. 15B is omitted.

A semiconductor chip 45 is disposed on a die pad 43. Sidewalls 48 are arranged so as to surround the die pad 43. An inner electrode 49a is arranged on an inner surface of the sidewall 48, and a sidewall external electrode 49b is arranged on an outer surface of the sidewall 48. A via 49c passing through the sidewall 48 and connecting the inner electrode 49a and the sidewall external electrode 49b electrically is formed in the sidewall 48. The inner electrode 49a and the sidewall external electrode 49b are formed by patterning.

One end of a bent inner lead 44 is arranged on the sidewall 48 so as to contact with the inner electrode 49a. A wire 46, whose one end is connected to the semiconductor chip 45, is connected to the other end of the inner lead 44. Therefore, the sidewall external electrode 49b is connected to the semiconductor chip 45 electrically. The resin 47 seals a region surrounded by the sidewalls 48 so as to cover the semiconductor chip 45, the wire 46, the inner lead 44 and the inner electrode 49a, thereby fixing the die pad 43 to the sidewalls 48.

Further, part of the inner lead 44 can be bent so as to be placed under the sidewall 48 as indicated by a dashed line, instead of being connected to the inner electrode 49a, and grounded, as a lead 44b, to an electrode (not shown) arranged under the semiconductor package 2m. By the configuration in which the lead 44b serves as an electrode, similarly to the ball 9a shown in FIG. 1B, it is possible to provide an electrode on the lower surface of the semiconductor package.

By the configuration described above, similarly to the semiconductor packages shown in Embodiments 1-4, it is possible newly to provide electrodes on the side surfaces of the semiconductor package on which the semiconductor chip is mounted, whereby the number of electrodes can be increased without changing the size of the semiconductor package.

Further, in Embodiments 1-5, in the case of configuring a semiconductor device in which semiconductor packages are connected in parallel, input/output signals of the semiconductor chip can be transmitted to another semiconductor chip without passing a substrate (not shown), by bringing their sidewall external electrodes or side external electrodes into contact with each other. Thus, it is possible to shorten the transmission path between the semiconductor chips.

Further, since it is unnecessary to use the multilayer substrates shown in Embodiments 1-4, a semiconductor package capable of connecting the semiconductor chip and the sidewall external electrode can be configured by a low-cost material.

Note here that, in the semiconductor packages according to Embodiments 1-3, the width of the side external electrode can be determined arbitrarily. Therefore, by setting the via constituting the side external electrode to have a manageable width, high machining accuracy is not required at the time of forming the side external electrode. Thereby, formation of the side external electrode becomes easy.

Further, the side external electrode can be formed by combining the electrical passage and via (connection wiring). Since the connection wiring can be positioned accurately in the stage of forming the substrate, it is possible to form the side external electrode easily without the necessity of increasing the machining accuracy at the time of exposing the connection wiring on the side surface of the substrate.

Further, in the semiconductor packages according to Embodiments 1-3, the diameter of the via can be set arbitrarily. Moreover, the size and the shape of the side external electrode can be set arbitrarily. With this configuration, by setting the wiring to have a manageable diameter, it is possible to form the side external electrode easily without the necessity of increasing the machining accuracy at the time of exposing the wiring on the side surface of the substrate.

Although the above description explains the case where the multilayer substrate has four layers, the substrate may have any number of layers, including one layer.

Note here that, although Embodiments 1-3 explain the case where the diameter of the via is larger than the width of the electrical passage, the diameter of the via may be smaller than the width of the electrical passage.

Further, Embodiments 1-3 explain the case where the side surface of the via has a rectangular shape or a tapered shape in cross section. Such a difference in shape is attributed to a difference in the method of manufacturing the via, and both of these shapes are acceptable. For example, when a drill is used to form a via, the via will have a rectangular shape in cross section. When a laser is used to form a via, the via will have a tapered shape in cross section.

Further, although Embodiments 4 and 5 explain the case where the inner electrode and the sidewall external electrode are connected in a one-to-one relationship, the present application is not limited to this configuration. For example, the number of the sidewall external electrodes can be less than the number of the inner electrodes by connecting wirings (vias) from a plurality of inner electrodes together so as to be connected to one sidewall external electrode inside the sidewall.

Further, although Embodiment 4 explains the case where the electrical passage on the surface of the substrate and the inner electrode are connected electrically, the electrical passage formed inside the substrate and exposed from the side surface of the substrate and the inner electrode may be connected electrically.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor package, comprising:
   a substrate;
   a semiconductor chip that is disposed on the substrate; and
   a connection wiring that is connected electrically to the semiconductor chip, the semiconductor package, further comprising:
   a sidewall that is formed of an insulator;
   an inner electrode that is formed on a first surface of the sidewall that faces the substrate; and
   a sidewall external electrode that is formed on a second surface of the sidewall that is different from the first surface,
   wherein the inner electrode and the sidewall external electrode are connected electrically, and the inner electrode is connected to the connection wiring.

2. The semiconductor package according to claim 1, wherein the connection wiring is laid on a surface of the substrate and inside the substrate in directions perpendicular and parallel to a plane of the substrate, exposed from the substrate, and contacts with the inner electrode.

3. The semiconductor package according to claim 1, wherein the sidewall external electrode is positioned so as to be connectable to a sidewall external electrode of another semiconductor package.

4. The semiconductor package according to claim 1, wherein not all of the sidewalls include the inner electrode and the sidewall external electrode.

5. The semiconductor package according to claim 1,
wherein a plurality of the sidewall external electrodes are formed in a direction perpendicular to a plane of the substrate,
the adjacent sidewall external electrodes do not contact with each other, and
a length of the sidewall in a direction along the substrate is the same as or longer than a length of a side of the substrate in contact with the sidewall.

6. The semiconductor package according to claim 1, wherein the number of the sidewall external electrodes is equal to or less than the number of the inner electrodes connected to the connection wiring.

7. The semiconductor package according to claim 1, further comprising a lid that is disposed on the sidewall or the semiconductor chip,
wherein the semiconductor chip is sealed by the substrate, the sidewall and the lid.

8. The semiconductor package according to claim 1, further including a mold resin that is poured into a region surrounded by the substrate and the sidewall,
wherein the semiconductor chip is sealed by the mold resin.

9. The semiconductor package according to claim 1, wherein the connection wiring is formed of an inner lead.

10. A semiconductor device comprising a plurality of semiconductor packages according to claim 1,
wherein the plurality of semiconductor packages are disposed so that surfaces thereof provided with the sidewall external electrode are adjacent to each other, and
the plurality of semiconductor packages are connected electrically by bringing their sidewall external electrodes into contact with each other.

* * * * *